(12) United States Patent
Hamashima

(10) Patent No.: US 12,057,328 B2
(45) Date of Patent: Aug. 6, 2024

(54) CLAMPING JIG AND CLEANING DEVICE

(71) Applicant: KYOCERA Corporation, Kyoto (JP)

(72) Inventor: Hiroshi Hamashima, Hikone (JP)

(73) Assignee: Kyocera Corporation, Kyoto (JP)

( * ) Notice: Subject to any disclaimer, the term of this patent is extended or adjusted under 35 U.S.C. 154(b) by 261 days.

(21) Appl. No.: 17/633,080

(22) PCT Filed: Jun. 25, 2020

(86) PCT No.: PCT/JP2020/024951
§ 371 (c)(1),
(2) Date: Feb. 4, 2022

(87) PCT Pub. No.: WO2021/024638
PCT Pub. Date: Feb. 11, 2021

(65) Prior Publication Data
US 2022/0293437 A1     Sep. 15, 2022

(30) Foreign Application Priority Data
Aug. 8, 2019  (JP) .................................. 2019-146481

(51) Int. Cl.
*H01L 21/67* (2006.01)
*H01L 21/687* (2006.01)

(52) U.S. Cl.
CPC .. *H01L 21/67057* (2013.01); *H01L 21/68707* (2013.01); *H01L 21/68757* (2013.01)

(58) Field of Classification Search
CPC ......... H01L 21/67057; H01L 21/68707; H01L 21/68757; H01L 21/68728; H01L 21/6704
See application file for complete search history.

(56) References Cited

U.S. PATENT DOCUMENTS

| | | | |
|---|---|---|---|
| 2003/0098048 A1* | 5/2003 | Kuroda ..................... | B08B 3/04 134/32 |
| 2011/0034034 A1 | 2/2011 | Du Bois et al. | |
| 2014/0041685 A1 | 2/2014 | Kaneko et al. | |
| 2014/0224427 A1* | 8/2014 | Takahashi ......... | H01J 37/32715 156/345.51 |
| 2018/0312974 A1 | 11/2018 | Noguchi et al. | |

FOREIGN PATENT DOCUMENTS

| | | |
|---|---|---|
| JP | H2-292822 A | 12/1990 |
| JP | H10-199964 A | 7/1998 |
| JP | 2003-229399 A | 8/2003 |
| JP | 2004-247582 A | 9/2004 |
| JP | 4565433 B2 | 10/2010 |
| JP | 2013-502052 A | 1/2013 |
| JP | 2014-154866 A | 8/2014 |
| JP | 2018-019017 A | 2/2018 |
| JP | 6302665 B2 | 3/2018 |
| KR | 10-2019-0042524 A | 4/2019 |
| WO | 2017/073679 A1 | 5/2017 |

* cited by examiner

*Primary Examiner* — Daniel McNally
(74) *Attorney, Agent, or Firm* — Procopio, Cory, Hargreaves & Savitch LLP

(57) ABSTRACT

A clamping jig according to the present disclosure includes a supporting portion extending in a vertical direction, and a bent portion connected to a top side of the supporting portion and configured to come into contact with an outer peripheral portion of a substrate. The bent portion includes a base end portion located on a side of the supporting portion and a tip portion connected to the base end portion. At least the tip portion contains a ceramic containing silicon carbide or aluminum oxide as a main component.

12 Claims, 2 Drawing Sheets

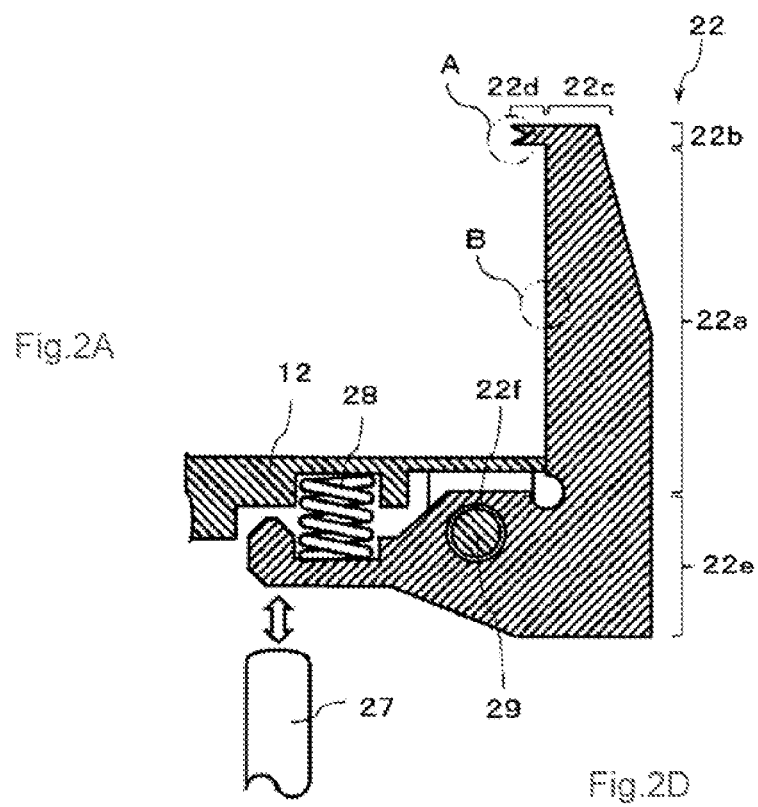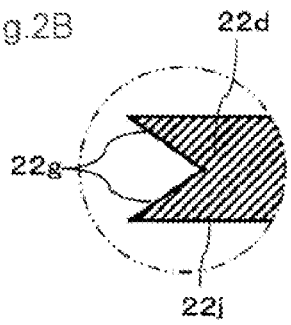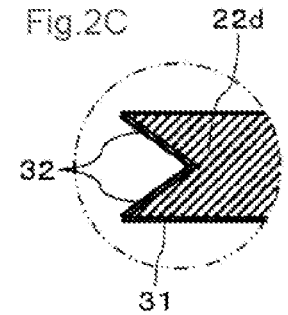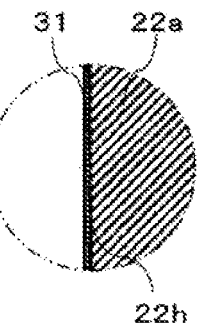

CLAMPING JIG AND CLEANING DEVICE

TECHNICAL FIELD

The present invention relates to a clamping jig and a cleaning device.

BACKGROUND ART

Conventionally, cleaning devices have been used in which a semiconductor substrate is cleaned with a cleaning solution such as a prescribed chemical solution, pure water, or the like to remove contaminants such as particles, organic contaminants, metal impurities, and the like attached to the substrate, as well as polymers after etching, and the like.

As a liquid treatment device including such a cleaning device, Patent Document 1 discloses a liquid treatment device including a holding means for horizontally holding a substrate, and the holding means includes a claw portion that holds an end surface of the substrate. Patent Document 2 describes that a claw portion (holding claw) is made of a plastic such as polyether ether ketone (PEEK) resin, for example.

CITATION LIST

Patent Literature

Patent Document 1: JP 4565433 B
Patent Document 2: JP 6302665 B

SUMMARY OF INVENTION

Technical Problem

When the claw portion described in Patent Document 1 is formed of a plastic such as polyether ether ketone (PEEK) resin, there is a problem that the claw portion has poor acid resistance. For example, when acid such as sulfuric acid, phosphoric acid, hydrochloric acid, or the like is used as a cleaning solution, there is a problem that the claw portion cannot be continuously used over a long period of time because of significant deterioration thereof.

The present invention has been devised to solve the problems described above, and an object of the present invention is to provide a clamping jig and a cleaning device that have excellent acid resistance and whose claw portion can be continuously used over a long period of time.

Solution to Problem

A clamping jig according to the present disclosure includes a supporting portion extending in a vertical direction, and a bent portion connected to a top side of the supporting portion and configured to come into contact with an outer peripheral portion of a substrate. The bent portion includes a base end portion located on a side of the supporting portion and a tip portion connected to the base end portion. The tip portion contains a ceramic containing silicon carbide or aluminum oxide as a main component.

Furthermore, a cleaning device according to the present disclosure includes the clamping jig described above.

Advantageous Effects of Invention

In the clamping jig of the present disclosure, the tip portion of the bent portion contains a ceramic containing silicon carbide or aluminum oxide having excellent acid resistance as a main component. Thus, the clamping jig of the present disclosure can be continuously used over a long period of time.

BRIEF DESCRIPTION OF DRAWINGS

FIG. 2A is a cross-sectional view illustrating the clamping jig illustrated in FIG. 1 and a mounted state in which the clamping jig is mounted on a rotary plate, FIG. 2B is an enlarged view illustrating an example of a portion A in FIG. 2A, FIG. 2C is an enlarged view illustrating another example of the portion A in FIG. 2A, and FIG. 2D is an enlarged view illustrating an example of a portion B in FIG. 2A.

DESCRIPTION OF EMBODIMENTS

Figure 1:
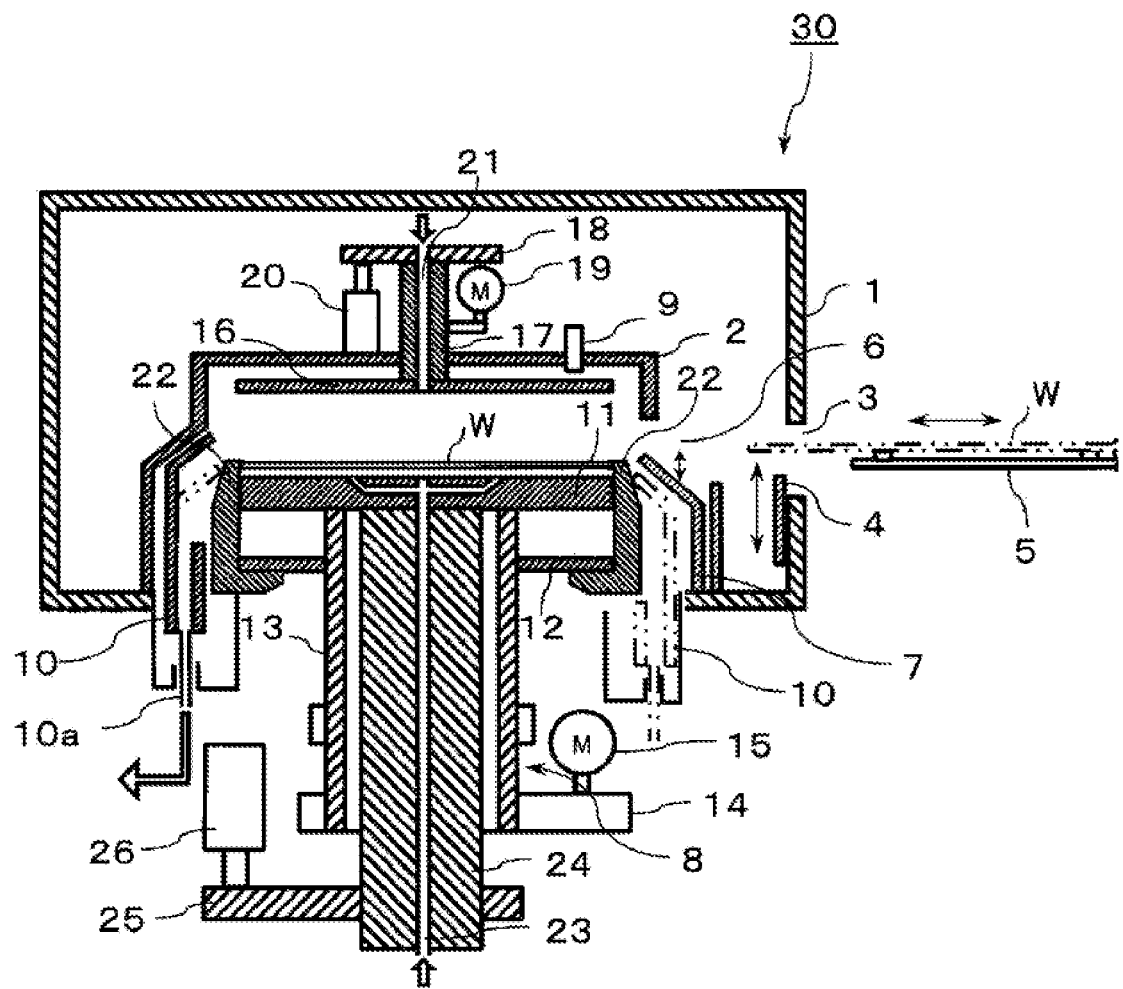
FIG. 1 is a schematic view illustrating a schematic configuration of a cleaning device equipped with clamping jigs according to an embodiment of the present disclosure.

Hereinafter, a clamping jig of the present disclosure will be described in detail with reference to the drawings. FIG. 1 is a schematic view illustrating a schematic configuration of a cleaning device 30 equipped with clamping jigs 22 according to an embodiment of the present disclosure.

The cleaning device 30 illustrated in FIG. 1 includes a housing 1 and a chamber 2 that provides a space for cleaning various substrates W such as a semiconductor wafer, a substrate for a liquid crystal display (LCD), and the like inside the housing 1.

The housing 1 includes a first window portion 3 through which the substrate W is carried into and out of the housing 1, and the first window portion 3 is opened and closed by a first shutter 4. A carrying arm 5 mounts the substrate W, and carries the substrate W into the housing 1 and carries the substrate W out from the housing 1 through the first window portion 3.

The first window portion 3 is closed by the first shutter 4 other than when the substrate W is being carried in and out. The first shutter 4 is disposed inside the housing 1, and opens and closes the first window portion 3 from the inside of the housing 1.

A chamber 2 includes a second window portion 6 through which the substrate W is carried into and out of the chamber 2, and the second window portion 6 is opened and closed by a second shutter 7. The carrying arm 5 enters into the chamber 2 or exits from the chamber 2 through the second window portion 6 to pass the substrate W to a rotary chuck 8 installed inside the chamber 2.

The second shutter 7 is disposed inside the chamber 2, and opens and closes the second window portion 6 from the inside of the chamber 2.

A gas supply portion 9 that supplies dry gas such as nitrogen into the chamber 2 is provided on a top panel of the chamber 2. The gas supply portion 9 supplies the dry gas downward to prevent the inside of the chamber 2 from filling up due to evaporation of a chemical solution supplied to the substrate W held by the rotary chuck 8. When the dry gas is supplied downward, watermarks, which are contaminants, are unlikely to occur on the surface of the substrate W.

In the chamber 2, a processing cup 10 that accommodates the substrate W, the rotary chuck 8 that holds the substrate W in the processing cup 10, an under plate 11 positioned away from the back surface of the substrate W, and a top plate 16 positioned away from the front surface of the substrate W are provided.

The processing cup 10 is provided with an inclined portion at the upper portion thereof, and is provided with a drain 10a at the bottom portion thereof. The processing cup 10 can be freely elevated and lowered between a position where the upper portion formed with the inclined portion of the processing cup 10 is positioned above the substrate W held by the rotary chuck 8 (in FIG. 1, the position is indicated by a solid line, and hereinafter, may be referred to as a "processing position") and a position where the upper portion is positioned below the substrate W held by the rotary chuck 8 (in FIG. 1, the position is indicated by a dashed-two dotted line, and hereinafter, may be referred to as a "retracted position").

When the substrate W is passed between the carrying arm 5 and the rotary chuck 8, the processing cup 10 is held at the retracted position so as not to prevent entry or exit of the carrying arm 5. On the other hand, when the substrate W held by the rotary chuck 8 is cleaned, the processing cup 10 is held at the processing position. The processing cup 10 held at the processing position prevents a cleaning solution supplied to the substrate W from being scattered to the surroundings, and further guides the cleaning solution used for cleaning the substrate W to the drain 10a. The drain 10a is connected to a cleaning solution collection line and an exhaust duct (that are not illustrated). The drain 10a is configured to discard mist or the like generated in the processing cup 10 and to collect the cleaning solution in the chamber 2.

The rotary chuck 8 includes a rotary plate 12 having a disk shape and a cylindrical body 13 having a cylindrical shape and connected to the rotary plate 12. Supporting tools (not illustrated) that support the substrate W and clamping jigs 22 that fix the substrate W are attached to the outer peripheral portion of the rotary plate 12. The supporting tools are disposed at at least three positions at equal intervals along a circumferential direction to support the substrate W from its back surface side. The clamping jigs 22 are disposed at at least three positions at equal intervals along the circumferential direction, and fix the substrate W from the outer peripheral surface side. A belt 14 is wound on the outer peripheral surface of the cylindrical body 13. By driving the belt 14 by a motor 15, the cylindrical body 13 and the rotary plate 12 can be rotated to rotate the substrate W fixed by the clamping jigs 22.

The under plate 11 is connected to a first shaft body 24 penetrating through the center of the rotary plate 12 and the inside of the cylindrical body 13. The first shaft body 24 is fixed to a horizontal plate 25, and the horizontal plate 25 along with the first shaft body 24 can be raised and lowered by a first elevating mechanism 26 such as an air cylinder. The under plate 11 and the first shaft body 24 are provided with a first channel 23 that supplies a cleaning solution such as a chemical solution, pure water or the like, or dry gas toward the substrate W.

The top plate 16 having a disk shape and positioned near the top panel of the chamber 2 is connected to a lower end of a second shaft body 17 having a cylindrical shape. The top plate 16 is rotatable by a motor 19 provided at a horizontal plate 18. The second shaft body 17 is rotatably supported by a lower surface of the second horizontal plate 18. The second horizontal plate 18 can be vertically raised and lowered by a second elevating mechanism 20, such as an air cylinder, fixed to the top panel of the chamber 2. A second channel 21 that supplies a cleaning solution such as a chemical solution, pure water or the like, or dry gas is provided along an axial direction in the inside of each of the top plate 16 and the second shaft body 17.

When the substrate W is passed between the rotary chuck 8 and the carrying arm 5, the top plate 16 is held at a position close to the top panel of the chamber 2 so as not to collide with the carrying arm 5. When the surface (upper surface) of the substrate W is cleaned, the top plate 16 is lowered to a position close to the surface of the substrate W held by the clamping jig 22, and a cleaning solution or the like is supplied through the second channel 21 toward the substrate W.

When the front and back surfaces (upper and lower surfaces) of the substrate W are simultaneously cleaned, the back surface of the substrate W is cleaned by using the under plate 11 and the first channel 23 at the same time as cleaning the surface of the substrate W described above. As a cleaning method for the back surface of the substrate W, for example, the under plate 11 is first brought into proximity with the back surface of the substrate W. Next, a chemical solution is supplied from the first channel 23 between the substrate W and the under plate 11 to form a chemical solution layer. The chemical solution is held for a predetermined period of time to perform chemical treatment, and then, pure water or the like is supplied from the first channel 23 between the substrate W and the under plate 11 to allow the chemical solution to flow out and then, to perform rinsing treatment. Next, a method of rotating the substrate W at a high speed while supplying dry gas between the substrate W and the under plate 11 from the first channel 23 is used.

Examples of the chemical solution include hydrochloric acid, a sulfuric acid hydrogen peroxide mixture (SPM, a mixture solution of sulfuric acid and a hydrogen peroxide solution), ammonia-based chemical solutions such as an ammonia hydrogen peroxide mixture (APM), hydrofluoric acid-based chemical solutions such as dilute hydrofluoric acid (DHF), sulfuric acid-based chemical solutions such as a sulfuric acid hydrogen peroxide mixture (SPM), phosphoric acid aqueous solutions, and the like.

After the substrate W is held by the clamping jigs 22, the substrate W is cleaned. At this time, after the processing cup 10 is raised, the chemical solution, and pure water that have been used, and the like are discharged from the drain 10a.

When the cleaning of the substrate W is finished, the processing cup 10 and under plate 11 are lowered. With the top plate 16 raised, the substrate W is transferred from the clamping jigs 22 to the supporting tools. Next, the first shutter 4 and the second shutter 7 are opened to allow the carrying arm 5 to enter into the chamber 2. In this state, the substrate W is transferred from the rotary chuck 8 to the carrying arm 5 by a reverse procedure to the above-described procedure for transferring the substrate W from the carrying arm 5 to the rotary chuck 8, and the substrate W is carried out from the cleaning device 30.

Next, the clamping jig 22 and a mounted state in which the clamping jig 22 is mounted on the rotary plate 12 will be described.

FIG. 2A is a cross-sectional view illustrating the clamping jig illustrated in FIG. 1 and the mounted state in which the clamping jig is mounted on the rotary plate, FIG. 2B is an enlarged view illustrating an example of a portion A in FIG. 2A, FIG. 2C is an enlarged view illustrating another example of the portion A in FIG. 2A, and FIG. 2D is an enlarged view illustrating an example of a portion B in FIG. 2A.

The clamping jig 22 includes a supporting portion 22a extending in a vertical direction, and a bent portion 22b connected to a top side of the supporting portion 22a and configured to come into contact with an outer peripheral portion of the substrate W. The bent portion 22b includes a base end portion 22c positioned on a side of the supporting portion 22a and a tip portion 22d connected to the base end portion 22c. A portion of the tip portion 22d that comes into contact with the outer peripheral portion of the substrate W has a claw-like shape, and a base portion 22e is connected to the supporting portion 22a from a bottom side of the supporting portion 22a, and supports the supporting portion 22a. The base portion 22e includes a through hole 22f along a width direction of the clamping jig 22.

The tip portion 22d includes a surface 22g that pinches the edges of the front and back surfaces of the substrate W from diagonally above and diagonally below. The substrate W is pinched and held by a groove formed by the surface 22g.

The tip portions 22d are provided separated from each other in the width direction of each of the clamping jigs 22. In a case where only one tip portion is present, when the tip portion 22d holds a portion of a notch (not illustrated) provided in the substrate W, the holding of the substrate W may become unstable, but the tip portions 22d separated at two positions can reliably hold the substrate W regardless of a position of the notch formed in the substrate W.

When a pressing member 27 is moved upward and a convex portion of the base portion 22e is pressed against the rotary plate 12, a spring 28 contracts and the entire clamping jig 22 rotates about a third shaft body 29 having a columnar shape as the center of rotation. At this time, the tip portion 22d moves to the outside of the rotary plate 12. On the other hand, when the pressing member 27 is moved downward and the spring 28 extends, the entire clamping jig 22 rotates about the third shaft body 29 as the center of rotation such that the tip portion 22d moves to an inner side of the rotary plate 12. As described above, the pressing member 27 and the spring 28 have a function of adjusting the position of the tip portion 22d. The clamping jig 22 described above is a clamping jig having the base portion 22e, but need not be provided with the base portion 22e.

At least the tip portion 22d of such a clamping jig 22 contains a ceramic containing silicon carbide or aluminum oxide as a main component. In the present specification, a "main component" means a component that accounts for 80 mass % or more among the total of 100 mass % of the components constituting the ceramic, and in particular, may mean a component that accounts for 90 mass % or more.

The components constituting the ceramic can be identified by an X-ray diffractometer using CuKα rays. The content of each component can be determined by using, for example, an inductively coupled plasma (ICP) emission spectrophotometer or a fluorescent X-ray analysis device.

When the tip portion 22d is formed of ceramic containing silicon carbide as a main component, boron and free carbon may be contained as other components. When the tip portion 22d is formed of ceramic containing aluminum oxide as a main component, oxide of each of magnesium, silicon, and calcium may be contained as other components.

When the tip portion 22d is formed of a ceramic having such excellent acid resistance, the obtained clamping jig can be used over a long period of time even in a case where acid is used as the cleaning solution of the substrate W.

The supporting portion 22a and the bent portion 22b may be separately formed or may be integrally formed. In particular, in a case where the supporting portion 22a and the bent portion 22b are integrally formed, even when the substrate W is repeatedly clamped and cleaned, because no bonding layer formed of glass or resin is present, the supporting portion 22a and the bent portion 22b are unlikely to be separated from each other with the boundary between the supporting portion 22a and the bent portion 22b serving as a starting point. The term "being integrally formed" means that the clamping jig 22 is obtained as an integrally formed product by powder compacting, machining, firing, and grinding rather than bonding the supporting portion 22a and the bent portion 22b.

A cut level difference (Rδc) that represents a difference between a cut level at a load length ratio of 25% in a roughness curve of the surface 22g of the tip portion 22d that comes into contact with the substrate W (hereinafter, the surface in contact with the substrate W may be referred to as a "contact surface"), and a cut level at a load length ratio of 75% in the roughness curve may be equal to or greater than 0.065 μm and equal to or less than 0.7 μm.

When the cut level difference (Rδc) is within the range described above, the contact surface 22g of the tip portion 22d has little unevenness and is relatively flat while maintaining an appropriate anchor effect. Thus, particle shedding from the contact surface 22g that tends to occur due to the clamping of the substrate W becomes less likely to occur. As a result, adverse effects such as damage to the substrate W caused by the particle shedding can be suppressed.

A variation coefficient of the cut level difference (Rδc) may be equal to or greater than 0.2 and equal to or less than 0.35. In a case where the variation coefficient of the cut level difference (Rδc) is within the range described above, even when the contact surface 22g is damaged, the adverse effects on the substrate W due to the damage are reduced. As a result, fine particles floating in the air are less likely to penetrate into the contact surface 22g, and thus, adverse effects on the substrate W due to the fine particles can be suppressed.

An arithmetic mean roughness (Ra) in a roughness curve of the surface (contact surface) 22g of the tip portion 22d that comes into contact with the substrate W may be equal to or ager greater than 0.06 μm and equal to or less than 3.7 μm. With such an arithmetic mean roughness (Ra), the contact surface 22g has little unevenness and is relatively flat while maintaining an appropriate anchor effect. Thus, the particle shedding from the contact surface 22g that tends to occur due to the clamping of the substrate W is more unlikely to occur. As a result, the adverse effects such as damage to the substrate W caused by the particle shedding can be suppressed.

The variation coefficient of the arithmetic mean roughness (Ra) may be equal to or greater than 0.15 and equal to or less than 0.35. In a case where the variation coefficient of the cut level difference (Rδc) is within such a range, even when the contact surface 22g is damaged, the adverse effects on the substrate W due to the damage are further reduced. As a result, fine particles floating in the air are less likely to penetrate into the contact surface 22g, and thus, the adverse effects on the substrate W due to the fine particles can be suppressed.

The supporting portion 22a may have a first facing surface 22h that faces the substrate W, and the tip portion 22d may have a connecting surface 22j that connects the surface 22g that comes into contact with the substrate W and the first facing surface 22h. The first facing surface 22h and the connecting surface 22j may include a first electrically conductive portion 31 including a layer or film having electrical conductivity. In a case where the first facing surface 22h and the connecting surface 22j include the first electrically conductive portion 31, even when charged particles having strong static electricity generated by the vaporization of the chemical solution adhere to the substrate W, the static electricity can be removed through the first electrically conductive portion 31. As a result, electrostatic breakdown of the substrate W can be suppressed.

Furthermore, in the clamping jig 22, at least a second facing surface 22g of the tip portion 22d facing the substrate W may include a second electrically conductive portion 32 including a layer or film having electrical conductivity, and a main surface of the second electrically conductive portion 32 may be a surface that comes into contact with the substrate W. In a case where the main surface of the second electrically conductive portion 32 is a surface that comes into contact with the substrate W, static electricity can be removed through the second electrically conductive portion 32 and the first electrically conductive portion 31 even when the charged particles described above adhere to the substrate W. As a result, electrostatic breakdown of the substrate W can be suppressed. Furthermore, fine particles floating in the air are less likely to adhere to the main surface of the second electrically conductive portion 32, and even when static electricity is generated due to adhesion of the fine particles, the static electricity can be easily removed.

The first electrically conductive portion 31 and the second electrically conductive portion 32 have a surface resistivity equal to or less than $1\times10^8 \Omega/\square$ at room temperature or a surface resistance value equal to or less than $1\times10^8 \Omega$. Examples of the constituent components include graphite, graphene, carbon nanotubes, fullerene, amorphous carbon, titanium, titanium nitride, titanium carbide, titanium carbonitride, or titanium oxide or aluminum titanate in which oxygen has been lost from a stoichiometric composition. In particular, the first electrically conductive portion 31 and the second electrically conductive portion 32 may have a surface resistivity equal to or less than $1\times10^4 \Omega/\square$ at room temperature or a surface resistance value equal to or less than $1\times10^4 \Omega$.

The surface resistivity can be measured in accordance with JIS C2141: 1992. In a case where a test piece for the surface resistivity measurement determined in JIS C2141: 1992 cannot be taken out from the first electrically conductive portion 31 or the second electrically conductive portion 32, the surface resistance value can be measured by using a tester or the like. The components constituting the first electrically conductive portion 31 and the second electrically conductive portion 32 can be identified by using an X-ray diffractometer.

When the first electrically conductive portion 31 is formed of graphite, graphene, carbon nanotubes, fullerene, or amorphous carbon, the supporting portion 22a may be formed of a ceramic containing silicon carbide as a main component. Similarly, when the second electrically conductive portion 32 is formed of graphite, graphene, carbon nanotubes, fullerene, or amorphous carbon, the tip portion 22d may be formed of a ceramic containing silicon carbide as a main component.

These components firmly stick to the surfaces of crystal particles of silicon carbide, or easily form a solid solution in the crystal particles of silicon carbide. In order to remove contaminants and the like firmly stuck to the surfaces, even when immersion is performed in a strong electrolyte solution having a degree of ionization being close to 1.0 for a long time (for example, 72 hours or longer), the particles constituting these components are difficult to peel off. As a result, the electrical conductivity can be maintained over a long period of time.

In a case where at least one of the first electrically conductive portion 31 and the second electrically conductive portion 32 is formed of graphite, a half value width of a diffraction peak from a (002) plane of the graphite by measurement using an X-ray diffraction method may be equal to or less than 0.3° (except for 0°). When the half value width is within such a range, the crystalline structure of the graphite can be a dense structure. In particular, the crystalline structure of the graphite is preferably a hexagonal crystalline structure called 2H graphite.

A layer thickness (film thickness) is, for example, equal to or larger than 30 nm, and may be particularly equal to or larger than 100 nm. The layer thickness (film thickness) can be measured, for example, by using images of cross sections taken with a scanning electron microscope.

The clamping jig 22 may have a cut level difference (Rδc), which represents a difference between a cut level at a load length ratio of 25% in a roughness curve of the main surface of the second electrically conductive portion 32 and a cut level at a load length ratio of 75% in the roughness curve, being equal to or greater than 0.065 μm and equal to or less than 0.7 μm. The clamping jig 22 may have a variation coefficient of the cut level difference (Rδc) being equal to or greater than 0.2 and equal to or less than 0.35.

The clamping jig 22 may have an arithmetic mean roughness (Ra) in the roughness curve of the main surface of the second electrically conductive portion 32 being equal to or greater than 0.06 μm and equal to or less than 3.7 μm. The clamping jig 22 may have a variation coefficient of the arithmetic mean roughness (Ra) being equal to or greater than 0.15 and equal to or less than 0.35. When the cut level difference (Rδc) and the arithmetic mean roughness (Ra) are within such a range, similar effects to those described above are exhibited.

The cut level difference (Rδc) and the arithmetic mean roughness (Ra) of the surface 22g and the main surface of the second electrically conductive portion 32 that come into contact with the substrate W can be measured in accordance with JIS B 0601-2001. Specifically, the measurement can be performed by using a shape analysis laser microscope (VK-X1100, or a successor model thereof available from KEYENCE CORPORATION). As the measurement conditions, first, an illumination method is employed with coaxial illumination, a magnification is set to 120 times, a cutoff value λs is not set, a cutoff value λc is set to 0.08 mm, a cutoff value λf is not set. a termination effect is to be corrected, and a measurement range for one point is set to 2740 μm×2090 μm from the contact surface 22g and the main surface of the second electrically conductive portion 32 to be measured. Next, four lines to be measured are drawn at approximately equal intervals along a longitudinal direction for each measurement range. Then, line roughness measurement can be performed on a total of eight lines to be measured of the contact surfaces 22g and the main surfaces of the second electrically conductive portions 32 of the respective tip portions 22d positioned at both sides in the width direction of the clamping jig 22. A length of one line is, for example, equal to or larger than 1600 μm and equal to or less than 1800 μm.

A mass change C per unit area indicated by the following Equation (1) when immersion is performed in hydrochloric acid having a concentration of 35 mass % and after 72 hours elapse from the start of the immersion may be equal to or less than 0.3 g/cm².

$$C=(W_0-W_1)/A \tag{1}$$

In the equation, $W_0$ indicates the mass of a test piece before immersion, $W_1$ indicates the mass of the test piece after 72 hours elapse from the start of the immersion, and A indicates a surface area of the test piece (cm²) before the immersion. The test piece is cut out from the clamping jig 22.

When the mass reduction ratio is equal to or less than 3%, the particles constituting each of the first electrically conductive portion 31 and the second electrically conductive portion 32 are less likely to be peeled off. As a result, immersion can be performed in hydrochloric acid over a long period of time, and the effect of removing contaminants is improved.

Next, an embodiment of a manufacturing method of the clamping jig according to the present disclosure will be described.

When the clamping jig of the present disclosure is made of a ceramic containing silicon carbide as a main component, a coarse-grained powder and a fine-grained powder are prepared as a silicon carbide powder, and are ground and mixed with water and, as necessary, a dispersing agent, for from 40 to 60 hours by using a ball mill or a bead mill to form a slurry. Here, the particle size of the fine-grained powder and the particle size of the coarse-grained powder after being ground and mixed are equal to or larger than 0.4 μm and equal to or less than 4 μm, and equal to or larger than 11 μm and equal to or less than 34μm, respectively. Next, the obtained slurry is added and mixed with graphite powder, a dispersing agent (hereinafter, it may be referred to as a "dispersing agent for graphite") that disperses the graphite powder, a sintering aid made of boron carbide powder and carbon powder being in an amorphous state or phenol resin, and a binder, and then, spray drying is performed to obtain granules whose main component is silicon carbide.

As for the mass ratios of the fine-grained powder and the coarse-grained powder, for example, the mass ratio of the fine-grained powder may be equal to or larger than 6 mass % and equal to or less than 15 mass %, and the mass ratio of the coarse-grained powder may be equal to or larger than 85 mass % and equal to or less than 94 mass %. In order to set an average value of an aspect ratio of silicon carbide particles being in a coarse-grained state in the ceramic to be equal to or larger than 1 and equal to or less than 2, a coarse-grained powder having an average value of an aspect ratio equal to or larger than 1 and equal to or less than 1.6 can be used in advance.

By using a dispersing agent for graphite, the dispersing agent can be adsorbed onto the graphite powder that is hydrophobic, and thus, can wet and infiltrate the graphite powder into a slurry with water serving as a solvent. Furthermore, relatively homogeneous granules containing graphite can be obtained because the dispersing agent for graphite acts to suppress the aggregation of graphite. Examples of the dispersing agent for graphite include anionic surfactants such as carboxylates such as sodium polycarboxylate, sulfonates, sulfate ester salts, and phosphate ester salts, and the like. By adsorbing an anionic surfactant that is a dispersing agent for graphite onto the graphite powder, the graphite powder is easily wetted with and infiltrated into a slurry. As a result, the charge repulsion of a hydrophilic group of the anionic surfactant suppresses the re-aggregation of the graphite powder. As a result, the graphite powder can be sufficiently dispersed without being aggregated in the slurry.

Next, the granules are filled into a powder compacting die and are pressed from a thickness direction at a pressure selected as appropriate within a range equal to or larger than 49 MPa and equal to or less than 147 MPa to obtain a powder compact. Then, the powder compact is subjected to machining to produce a precursor of the clamping jig having the shape illustrated in FIG. 2A. This precursor is degreased in a nitrogen atmosphere at a temperature equal to or higher than 450° C. and equal to or lower than 650° C. for a holding time equal to or longer than 2 hours and equal to or shorter than 10 hours to obtain a degreased body. Next, the degreased body is held at a temperature equal to or higher than 1800° C. and equal to or lower than 2200° C. for a period of time equal to or longer than 3 hours and equal to or shorter than 6 hours in a decompressed atmosphere of inert gas such as argon to obtain a sintered compact.

The manufacturing method described above is a manufacturing method when graphite is contained in a slurry in advance. When the slurry described above does not contain graphite, a precursor of the clamping jig having the shape illustrated in FIG. 2A is first produced. An IPA solution containing graphite powder is sprayed onto the surface of the precursor by using a spray coating device. Here, the average particle size of the graphite powder may be, for example, equal to or larger than 10 μm and equal to or less than 100 μm. The content of the graphite powder with respect to 100 parts by mass of the IPA solution may be, for example, equal to or larger than 1 part by mass and equal to or less than 5 parts by mass. The precursor obtained by spraying the graphite powder onto the surface thereof is sequentially degreased and sintered as described above, and is thereby allowed to be a sintered compact provided with the first electrically conductive portion and the second electrically conductive portion.

When the clamping jig of the present disclosure is formed of, for example, a ceramic containing aluminum oxide as a main component, aluminum oxide powder (whose purity is equal to or larger than 99.9 mass %) and powders of magnesium hydroxide, silicon oxide, and calcium carbonate are put into a grinding mill together with a solvent (ion exchange water). After grinding is performed until an average particle size ($D_{50}$) of the powder becomes equal to or less than 1.5 μm, an organic binder and a dispersing agent that disperses the aluminum oxide powder are added and mixed to obtain a slurry. Here, among a total of 100 mass % of the powder described above, the content of the magnesium hydroxide powder is from 0.3 mass % to 0.42 mass %, the content of the silicon oxide powder is from 0.5 mass % to 0.8 mass %, the content of the calcium carbonate powder is from 0.06 mass % to 0.1 mass %, and the remainder thereof is aluminum oxide powder and inevitable impurities.

The organic binder is not limited, and examples of the organic binder include acrylic emulsions, polyvinyl alcohol, polyethylene glycol, polyethylene oxide, and the like. The slurry is then spray-granulated to obtain granules. A precursor of the clamping jig is then obtained in a manner similar to that described above. The precursor can be held at a temperature equal to or higher than 1500° C. and equal to or lower than 1700° C. for a period of time equal to or longer than 4 hours and equal to or shorter than 6 hours to obtain a sintered compact.

The contact surface of the tip portion is obtained by buffing a surface of a tip portion of the sintered compact. Specifically, a base material of the buff is felt, and the contact surface may be polished by using a paste-like abrasive obtained by adding diamond powder having an average particle size being equal to or larger than 1 μm and equal to or less than 4 μm to oils and fats.

For example, in order to obtain the clamping jig having a cut level difference (Rδc) of the contact surface thereof being equal to or greater than 0.065 μm and equal to or less than 0.7 μm, diamond powder having an average particle size equal to or larger than 2 μm and equal to or less than 4 μm may be used, and the rotation speed of the buff may be equal to or higher than 2000 rpm and equal to or lower than 3000 rpm.

For example, in order to obtain the clamping jig having a variation coefficient of the cut level difference (Rδc) of the contact surface thereof equal to or greater than 0.2 and equal to or less than 0.35, diamond powder having an average particle size equal to or larger than 2 μm and equal to or less than 4 μm may be used, and the rotation speed of the buff may be equal to or higher than 1000 rpm and equal to or lower than 2000 rpm.

For example, in order to obtain the clamping jig having an arithmetic mean roughness (Ra) of the contact surface thereof equal to or greater than 0.06 μm and equal to or less than 3.7 μm, diamond powder having an average particle size equal to or larger than 1 μm and equal to or less than 2 μm may be used, and the rotation speed of the buff may be equal to or higher than 2000 rpm and equal to or lower than 3000 rpm.

For example, in order to obtain the clamping jig having a variation coefficient of the arithmetic mean roughness (Ra) of the contact surface thereof equal to or greater than 0.15 and equal to or less than 0.35, diamond powder having an average particle size equal to or larger than 1 μm and equal to or less than 2 μm may be used, and the rotation speed of the buff may be equal to or higher than 1000 rpm and equal to or lower than 2000 rpm.

In a case where a clamping jig including a film having electrical conductivity on the surface of the tip portion facing the substrate W is obtained, after the buffing described above is performed, the film may be formed by vapor deposition, sputtering or the like such that the film thickness is, for example, equal to or larger than 30 nm and equal to or less than 120 nm. When the film thickness is within this range, because the film itself is thin, the surface properties obtained by the buffing are maintained.

The clamping jig obtained by the manufacturing method described above is formed of a ceramic having excellent acid resistance. Thus, the clamping jig according to the present disclosure can be continuously used over a long period of time, for example, as a member for a cleaning device, or the like.

REFERENCE SIGNS LIST

1 Housing
2 Chamber
3 First window portion
4 First shutter
5 Carrying arm
6 Second window portion
7 Second shutter
8 Rotary chuck
9 Gas supply portion
10 Processing cup
11 Under plate
12 Rotary plate
13 Cylindrical body
14 Belt
15 Motor
16 Top plate
17 Second shaft body
18 Second horizontal plate
19 Motor
20 Second elevating mechanism
21 Second channel
22 Clamping jig
22a Supporting portion
22b Bent portion
22c Base end portion
22d Tip portion
22e Base portion
22f Through hole
22g Contact surface (second facing surface)
22h First facing surface
22j Connecting surface
23 First channel
24 First shaft body
25 Horizontal plate
26 First elevating mechanism
27 Pressing member
28 Spring
29 Third shaft body
30 Cleaning device
31 First electrically conductive portion
32 Second electrically conductive portion

The invention claimed is:

1. A clamping jig comprising:
a supporting portion extending in a vertical direction; and
a bent portion connected to a top side of the supporting portion and configured to come into contact with an outer peripheral portion of a substrate,
the bent portion comprising a base end portion located on a side of the supporting portion, and a tip portion connected to the base end portion, wherein
the supporting portion comprises a first facing surface configured to face the substrate,
the tip portion comprises a connecting surface that connects a surface configured to come into contact with the substrate and the first facing surface,
the first facing surface and the connecting surface comprise a first electrically conductive portion comprising a layer or film with electrical conductivity,
the tip portion comprises a ceramic containing silicon carbide or aluminum oxide as a main component, and
a mass change C per unit area indicated by the following Equation (1) when immersion is performed in hydrochloric acid having a concentration of 35 mass % and after 72 hours elapse from start of the immersion is equal to or less than 0.3 g/cm$^2$, $$C=(W_0-W_1)/A \quad (1)$$

where, in the Equation (1), $W_0$ indicates mass of a test piece before the immersion, $W_1$ indicates mass of the test piece after the 72 hours elapse from the start of the immersion, and A indicates a surface area of the test piece (cm$^2$) before the immersion.

2. The clamping jig according to claim 1, wherein
a second facing surface of the tip portion configured to face the substrate comprises a second electrically conductive portion comprising a layer or film with electrical conductivity, and
a main surface of the second electrically conductive portion is configured to come into contact with the substrate.

3. The clamping jig according to claim 2, wherein
a cut level difference (Rδc) representing a difference between a cut level at a load length ratio of 25% in a roughness curve of the main surface of the second electrically conductive portion and a cut level at a load length ratio of 75% in the roughness curve of the main surface of the second electrically conductive portion is equal to or greater than 0.065 μm and equal to or less than 0.7 μm.

4. The clamping jig according to claim 3, wherein
an arithmetic mean roughness (Ra) in the roughness curve of the main surface of the second electrically conductive portion is equal to or greater than 0.06 µm and equal to or less than 3.7 µm.

5. The clamping jig according to claim 4, wherein a variation coefficient of the arithmetic mean roughness (Ra) in the roughness curve of the main surface of the second electrically conductive portion is equal to or greater than 0.15 and equal to or less than 0.35.

6. The clamping jig according to claim 3, wherein a variation coefficient of the cut level difference (Rδc) is equal to or greater than 0.2 and equal to or less than 0.35.

7. The clamping jig according to claim 1, wherein a cut level difference (Rδc) representing a difference between a cut level at a load length ratio of 25% in a roughness curve of a surface of the tip portion configured to come into contact with the substrate and a cut level at a load length ratio of 75% in the roughness curve of the surface of the tip portion is equal to or greater than 0.065 µm and equal to or less than 0.7 µm.

8. The clamping jig according to claim 7, wherein an arithmetic mean roughness (Ra) in the roughness curve of the surface of the tip portion configured to come into contact with the substrate is equal to or greater than 0.06 µm and equal to or less than 3.7 µm.

9. The clamping jig according to claim 8, wherein a variation coefficient of the arithmetic mean roughness (Ra) is equal to or greater than 0.15 and equal to or less than to 0.35.

10. The clamping jig according to claim 7, wherein a variation coefficient of the cut level difference (Rδc) is equal to or greater than 0.2 and equal to or less than 0.35.

11. The clamping jig according to claim 1, wherein the supporting portion and the bent portion are integrally formed.

12. A cleaning device comprising:
the clamping jig according to claim 1.

* * * * *